United States Patent
Saraf

(10) Patent No.: US 10,998,689 B2
(45) Date of Patent: May 4, 2021

(54) SYSTEMS, APPARATUS, AND METHODS FOR PRODUCING ULTRA STABLE, SINGLE-FREQUENCY, SINGLE-TRANSVERSE-MODE COHERENT LIGHT IN SOLID-STATE LASERS

(71) Applicant: Shailendhar Saraf, San Jose, CA (US)

(72) Inventor: Shailendhar Saraf, San Jose, CA (US)

( * ) Notice: Subject to any disclaimer, the term of this patent is extended or adjusted under 35 U.S.C. 154(b) by 0 days.

(21) Appl. No.: 16/249,360

(22) Filed: Jan. 16, 2019

(65) Prior Publication Data

US 2019/0229488 A1 Jul. 25, 2019

Related U.S. Application Data

(60) Provisional application No. 62/619,250, filed on Jan. 19, 2018.

(51) Int. Cl.
*H01S 3/30* (2006.01)
*H01S 3/094* (2006.01)
(Continued)

(52) U.S. Cl.
CPC .......... *H01S 3/094003* (2013.01); *G02B 6/42* (2013.01); *H01S 3/06729* (2013.01);
(Continued)

(58) Field of Classification Search
CPC .......... H01S 3/09415; H01S 3/094053; H01S 3/0941; H01S 3/025; H01S 3/027;
(Continued)

(56) References Cited

U.S. PATENT DOCUMENTS 3,122,702 A * 2/1964 Franken .................. G01R 33/26
324/304
3,639,855 A * 2/1972 Dillon, Jr. ................ H01S 3/102
372/27

(Continued)

OTHER PUBLICATIONS

Saraf et al, "Quantum noise measurements in a continuous-wave laser-diode-pumped Nd:YAG saturated amplifier," Optics Letters, May 15, 2005, vol. 30, No. 10, pp. 1195-1197.

*Primary Examiner* — Tod T Van Roy
*Assistant Examiner* — Delma R Fordé
(74) *Attorney, Agent, or Firm* — Michael A. Rodriguez

(57) ABSTRACT

A laser system has a fiber cable, a pump enclosure connected to the fiber cable outside of the pump enclosure, and a laser-head enclosure connected to the fiber cable disposed outside of the laser-head enclosure. The pump enclosure houses a fiber-coupled laser diode configured to produce and convey pump light through the pump enclosure out to the fiber cable. The laser-head enclosure houses a crystal. The pump light, when produced by the laser diode, propagates out from the pump enclosure through the fiber cable into the laser-head enclosure and into the crystal. The crystal produces a laser beam in response to the pump light. The integrated fiber of the laser diode, the fiber cable, and internal fiber of the laser-head enclosure, through which the pump light propagates, may be single-mode fibers, to achieve superior laser system performance with lower frequency and intensity noise than pumping through multi-mode fibers.

21 Claims, 12 Drawing Sheets

(51) Int. Cl.
*H01S 3/067* (2006.01)
*H01S 3/0941* (2006.01)
*G02B 6/42* (2006.01)
*H01S 5/02251* (2021.01)
*H01S 3/04* (2006.01)
*H01S 3/131* (2006.01)
*H01S 3/06* (2006.01)
*H01S 3/102* (2006.01)
*H01S 3/02* (2006.01)
*H01S 5/024* (2006.01)
*H01S 3/042* (2006.01)
*H01S 3/00* (2006.01)
*H01S 5/02* (2006.01)

(52) U.S. Cl.
CPC ........ *H01S 3/06754* (2013.01); *H01S 3/0941* (2013.01); *H01S 3/09415* (2013.01); *H01S 3/094053* (2013.01); *H01S 3/094096* (2013.01); *H01S 5/02251* (2021.01); *H01S 3/0092* (2013.01); *H01S 3/025* (2013.01); *H01S 3/042* (2013.01); *H01S 3/0405* (2013.01); *H01S 3/0606* (2013.01); *H01S 3/0627* (2013.01); *H01S 3/102* (2013.01); *H01S 3/131* (2013.01); *H01S 5/02* (2013.01); *H01S 5/02415* (2013.01)

(58) Field of Classification Search
CPC ........ G02B 6/38; G02B 6/381; G02B 6/3887; G02B 6/3807; G02B 6/3628; G02B 6/44; G02B 6/241; G02B 6/3616; G02B 6/3869; G02B 6/42–4298
See application file for complete search history.

(56) References Cited

U.S. PATENT DOCUMENTS

| | | | | |
|---|---|---|---|---|
| 4,723,257 A * | 2/1988 | Baer | .................... | G02B 6/4204 372/107 |
| 5,181,214 A * | 1/1993 | Berger | .................. | H01S 3/042 372/21 |
| 5,495,494 A * | 2/1996 | Molva | .................... | H01S 3/113 372/98 |
| 5,608,742 A * | 3/1997 | Petersen | ............. | H01S 3/09415 372/105 |
| 5,663,979 A * | 9/1997 | Marshall | ............. | H01S 3/09415 372/103 |
| 5,708,672 A * | 1/1998 | Pessot | .................. | H01S 3/0627 372/23 |
| 5,940,425 A * | 8/1999 | Lasser | ................. | H01S 3/09415 372/6 |
| 5,999,554 A * | 12/1999 | Marshall | ............. | H01S 3/09415 372/71 |
| 6,011,810 A * | 1/2000 | Haller | ................... | H01S 5/3054 257/607 |
| 6,014,393 A * | 1/2000 | Fulbert | ................ | H01S 3/0627 372/40 |
| 6,434,177 B1 * | 8/2002 | Jurgensen | .......... | H01S 3/09415 372/101 |
| 6,539,044 B1 * | 3/2003 | Kuzuta | ............... | H01S 3/09415 372/69 |
| 6,580,052 B1 * | 6/2003 | Bartelt-Berger | ...... | G02B 6/4216 219/121.64 |
| 9,444,215 B1 * | 9/2016 | Gapontsev | ........... | H01S 3/0941 |
| 2003/0161379 A1 * | 8/2003 | Wolak | .................. | G02B 6/4206 372/108 |
| 2007/0096857 A1 * | 5/2007 | Webb | .................. | G01N 27/9013 335/299 |
| 2009/0251697 A1 * | 10/2009 | Cutillas | ................ | G02B 6/4204 356/400 |
| 2011/0038035 A1 * | 2/2011 | Taylor | .................... | H01S 3/302 359/334 |
| 2011/0069376 A1 * | 3/2011 | Diening | .............. | H01S 3/06704 359/329 |
| 2012/0243568 A1 * | 9/2012 | Chang | ................ | H01S 3/06791 372/30 |
| 2015/0349481 A1 * | 12/2015 | Kliner | ................... | H01S 3/0675 359/341.3 |
| 2016/0036193 A1 * | 2/2016 | Eno | ....................... | H01S 3/0941 250/216 |
| 2016/0218480 A1 * | 7/2016 | Sakai | ................ | H01S 3/094053 |

* cited by examiner

SYSTEMS, APPARATUS, AND METHODS FOR PRODUCING ULTRA STABLE, SINGLE-FREQUENCY, SINGLE-TRANSVERSE-MODE COHERENT LIGHT IN SOLID-STATE LASERS

RELATED APPLICATION

This application claims the benefit of and priority to co-pending U.S. Provisional Application No. 62/619,250 titled "Systems, Apparatus, and Methods for Producing Ultra Stable, Single-Frequency, Single-Transverse-Mode Coherent Light in Solid-State Lasers," filed on Jan. 19, 2018, the entirety of which provisional application is incorporated by reference herein for all purposes.

FIELD OF THE INVENTION

The invention relates generally to solid-state lasers. More particularly, the invention relates to methods and apparatuses that use solid-state laser crystals and fiber-coupled laser diodes to produce low-noise laser power.

BACKGROUND

Solid-state laser systems are based on solid-state gain media, for example, crystals, glasses, and ceramics. Typically, the gain media is doped with the laser-active ions (e.g., rare-earth ions or transition metal ions). Optical pump sources optically pump the gain media to supply energy to the laser-active ions. Common types of optical pump sources include discharge lamps (e.g., flash lamps and arc lamps) and laser diodes. Although discharge lamps are relatively inexpensive and can supply high power, their shortcomings include low power efficiency, a mediocre lifespan, and unwanted thermal effects. Consequently, solid-state laser systems are often using laser diodes to optically pump the gain media.

In a typical solid-state laser system that uses a laser diode to directly pump a solid-state laser crystal, that laser diode is located in the same enclosure as the laser-head. Aging of the laser diode, however, reduces the pump light intensity, changes the pump light spatial mode, and deteriorates the mode of the laser light generated in the crystal. Additionally, failure of the laser diode results in a non-functional unit that needs to be sent back to the factory for costly repairs, if such repairs are possible.

Another shortcoming of some traditional laser systems is the use of multi-mode fibers for pumping the laser crystals. However, these multi-mode fibers are susceptible to a variable pump light profile from perturbation of the fiber, thereby introducing intensity and frequency noise in the laser output.

SUMMARY

All examples and features mentioned below can be combined in any technically feasible way.

In one aspect, the invention relates to a laser system comprising a fiber optic cable, a pump enclosure connected to a first end of the fiber optic cable disposed outside of the pump enclosure, and a laser-head enclosure connected to an opposite end of the fiber optic cable disposed outside of the laser-head enclosure. The pump enclosure houses a fiber-coupled laser diode configured to produce and convey pump light through the pump enclosure out to the fiber optic cable. The laser-head enclosure houses a crystal. The pump light, when produced by the fiber-coupled laser diode, propagates out from the pump enclosure through the fiber optic cable into the laser-head enclosure and into the crystal. The crystal is adapted to produce a laser beam in response to the pump light.

In one embodiment, the fiber-coupled laser-diode and fiber optic cable comprise single-mode fibers.

In another aspect, the invention relates to a laser-head module comprising an enclosure with a wall having a fiber port through which to receive pump light from an external pump light source. The enclosure houses a laser-crystal assembly with a crystal, a resident fiber having an input end and an output end, and a lens assembly disposed adjacent to the output end of the resident fiber. The input end of the resident fiber is coupled to the fiber port to receive the pump light from the external pump light source. The lens assembly focuses the pump light onto a face of the crystal of the laser-crystal assembly. The crystal is adapted to produce a laser beam in response to the pump light.

In one embodiment, the resident fiber comprises a single-mode fiber.

In another embodiment, the enclosure further houses a permanent magnet disposed near the crystal. The permanent magnet produces a magnetic field across the crystal that causes the crystal to lase in one direction.

The lens assembly may include first and second spaced apart lenses wherein the first lens collimates the pump light exiting the output end of the resident fiber and the second lens focuses the collimated pump light onto the face of the crystal.

The laser-crystal assembly may include a piezoelectric device disposed adjacent to the crystal, wherein the piezoelectric device is adapted to control of a lasing wavelength of the crystal in response to a voltage applied to the piezoelectric device.

The laser-crystal assembly may include a heat-controlling element in thermal communication with the crystal, wherein the heat-controlling element is adapted to control a temperature of the crystal in order to control a lasing wavelength of the crystal and may further include a thermally conductive plate disposed between the crystal and the heat-controlling element, wherein the plate has a thermistor configured to read a temperature of the crystal and is adapted to facilitate heat transfer between the crystal and the heat-controlling element.

The laser-head module may further comprise a radiofrequency (RF) coil disposed close enough to the crystal such that a magnetic field produced by the RF coil passes through the crystal and tunes a lasing wavelength of the crystal.

The laser-head module may further comprise a mount secured to the enclosure that couples the output end of the resident fiber to the lens assembly.

In another aspect, the invention relates to a laser-diode module comprising an enclosure with a wall having a fiber port through which to emit pump light. The enclosure houses a fiber-coupled laser diode having a fiber coupled at one end to an output of the laser diode and at an opposite end to the fiber port. The fiber-coupled laser diode outputs a pump beam into the fiber. The fiber coupled at one end to the output of the laser diode may be a single-mode fiber. The laser-diode module may further comprise a heat-controlling element disposed between the fiber-coupled laser diode and an interior surface of the enclosure.

In another aspect, the invention relates to a method for generating laser light comprising the steps of generating pump light by a fiber-coupled laser diode housed within a first enclosure, conveying the pump light from the fiber-coupled laser diode out to a fiber cable that is external to the first enclosure, conveying the pump light from the external fiber cable into a second enclosure that houses a crystal assembly, pumping a crystal of the crystal assembly with the pump light to produce laser light, and emitting the laser light from the second enclosure.

The crystal may be induced to lase in one direction by generating a magnetic field across the crystal.

The method may further comprise propagating the pump light from the external fiber cable into a resident fiber disposed within the second enclosure, collimating the pump light exiting an output end of the resident fiber, and focusing the collimated pump light onto a face of the crystal. The method may further comprise tuning a lasing wavelength of the crystal by applying a voltage to a piezoelectric device disposed adjacent to the laser crystal, by controlling a temperature of the crystal, by producing with a radio frequency coil a uniform magnetic field across the crystal, or any combination thereof.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Solid-state laser systems described herein mitigate problems arising from laser diode degradation or failure by having the laser diode in a separate enclosure from the enclosure containing the laser head. Separation of the laser diode (also referred to as a pump or pump diode) from the laser head facilitates repair of the laser system; replacing or repairing the laser-diode module does not involve or disturb the laser-head module. Having the laser diode in a separate enclosure also reduces the thermal load inside the laser-head enclosure and reduces power and frequency fluctuations that are inherent to lasers that are directly pumped with laser diodes. In addition, using a single-mode fiber-coupled laser diode in the laser diode enclosure, a single-mode resident fiber in the laser-head enclosure, and a single-mode fiber to make a connection between the single-mode fibers in the two enclosures, provides immunity to perturbation of the pump profile from environmental disturbances like fiber movement and changes in temperature and pressure. Pumping light through these single-mode fibers, from the laser diode to the laser-head crystal, achieves laser system performance that is superior in terms of lower frequency and intensity noise in comparison to pumping light through multimode fibers.

Figure 1:
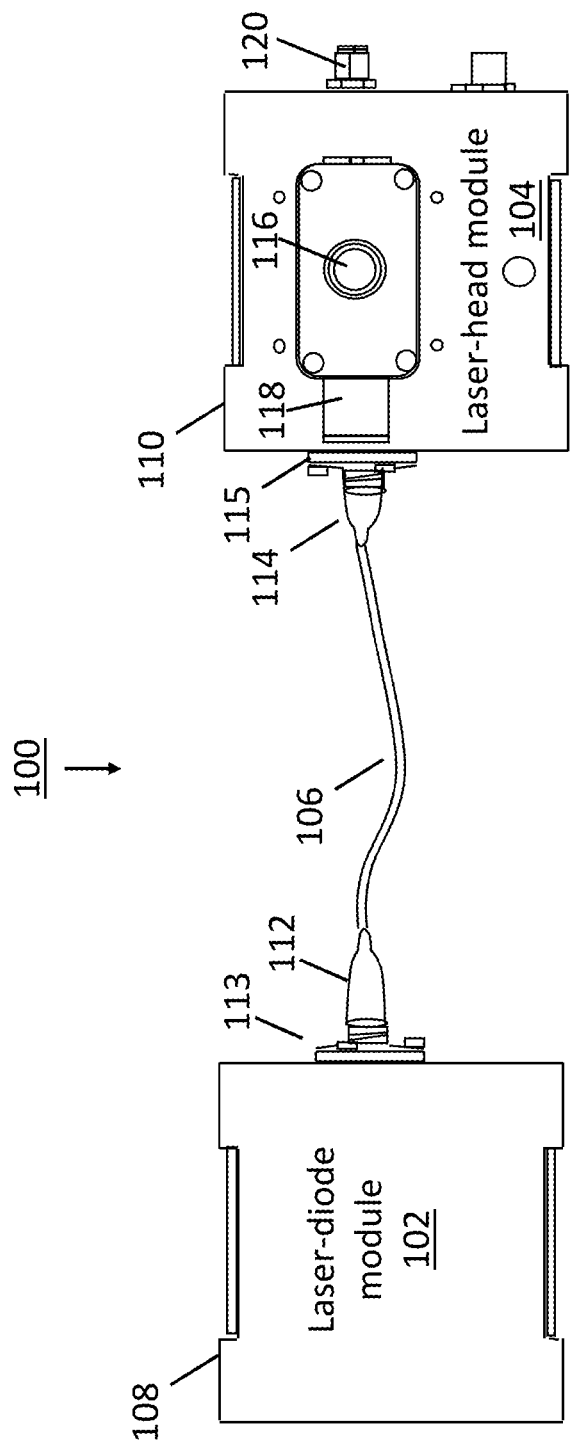
FIG. 1 is a diagram of an embodiment of a solid-state laser system including a laser-diode module coupled by a fiber optic cable to a laser-head module.

FIG. 1 shows an embodiment of a solid-state laser system 100 capable of producing a single-frequency, single-transverse-mode laser beam of exceptional spectral and spatial purity. The solid-state laser system 100 includes a laser-diode module 102 (also referred to as a pump module or pump unit) coupled to a laser-head module 104 by a fiber optic cable 106. The laser-diode module 102 and laser-head modules 104 are embodied in separate enclosures. The laser-diode module 102 comprises an enclosure 108 that houses a laser diode assembly (not shown) adapted to produce a light beam (also referred to as pump light or pump beam) used to pump a laser crystal. The laser-head module 104 comprises an enclosure 110 that houses a solid-state laser crystal assembly (not shown) adapted to produce clean laser power in response to an incoming pump beam provided by the laser-diode module 102. The enclosures 108, 110 can have a modular design, that is, the enclosures can be units of approximately standardized size, design, or construction, and can be arranged or fitted together in various ways to achieve a variety of applications. In one embodiment, each of the separate enclosures is approximately cubic in shape.

One end of the fiber optic cable 106 terminates at a fiber connector 112 that connects to a fiber optic adapter 113 mounted to the external side of a wall of the laser-diode enclosure 108; the opposite end of the fiber optic cable 106 terminates at a fiber connector 114 that connects to a fiber optic adapter 115 mounted the external side of a first wall of the laser-head enclosure 110. The fiber optic cable 106 can be a single-mode fiber or a multimode fiber; the type of fiber matches the type of fiber used by the laser-diode and laser-head modules. One embodiment of the single-mode fiber has a 6 µm core; an embodiment of the multimode fiber has a 105 µm core. In a second wall of the laser-head enclosure 110 is an aperture 116 out of which a laser beam exits. A manually movable shutter 118 (shown here in the open position) is disposed adjacent the aperture and is adapted to slide across the aperture 116 to block the path of the laser beam. A third wall of the laser-head enclosure 110 has electrical connectors (one shown) 120.

During operation of the laser system 100, the laser-diode module 102 produces a pump beam. The pump beam exits the laser-diode enclosure 108 through the fiber optic adapter 113 and passes through the fiber optic cable 106 to the laser-head enclosure 110. The pump beam enters the laser-head enclosure 110 through the fiber optic adapter 115 and pumps the solid-state crystal assembly housed therein. As described in more detail below, the laser-head module 104 is configured to produce low-noise and stable laser light in the near-infrared, visible or far-infrared regions of the electromagnetic radiation spectrum when the pump light from the laser-diode module 102 pumps a laser crystal of the solid-state crystal assembly. The laser light exits the laser-head enclosure 110 through the aperture 116.

Figure 2:
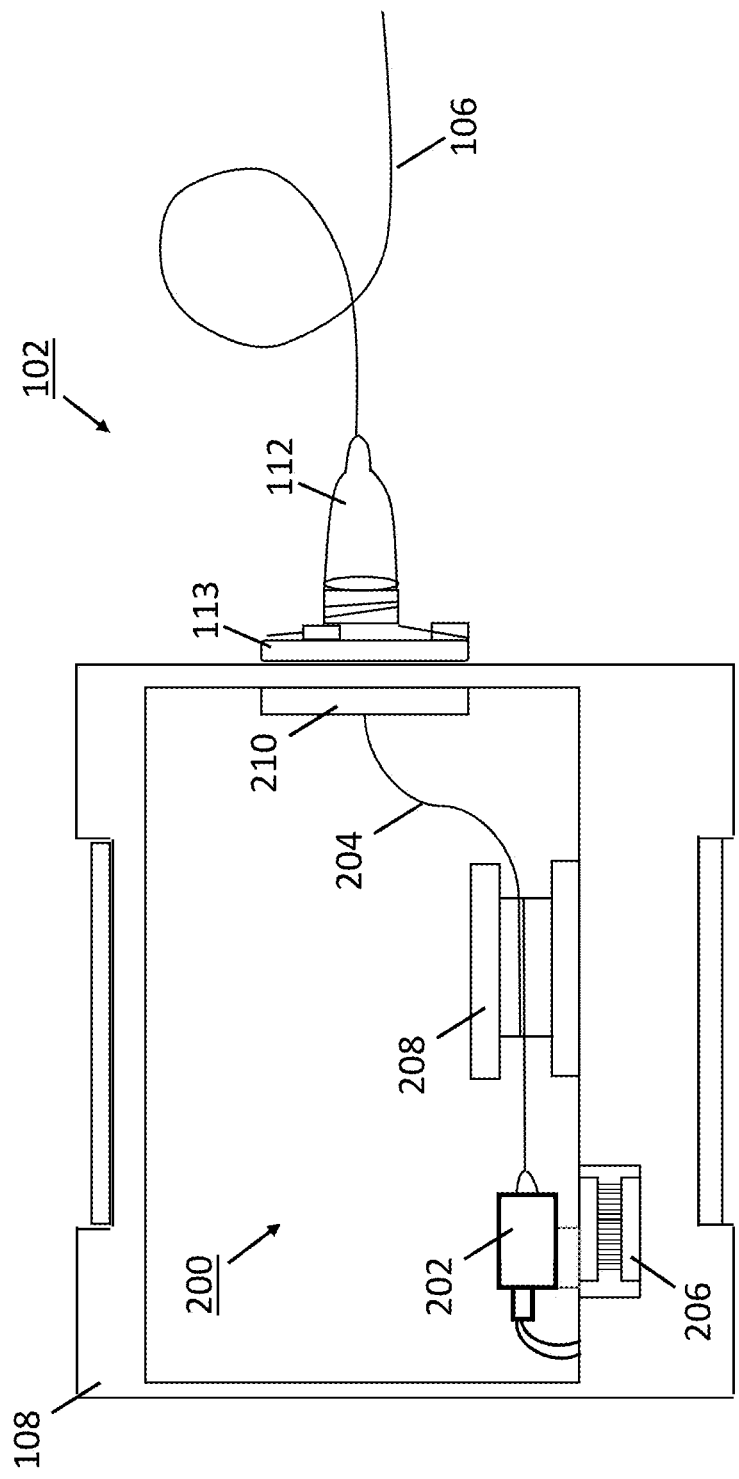
FIG. 2 is a cut-away of one embodiment of the laser-diode module comprised of an enclosure housing a fiber-coupled laser-diode assembly.

FIG. 2 shows a cut-away of one embodiment of the laser-diode module 102 comprised of the enclosure 108 housing a fiber-coupled laser-diode assembly 200. The laser-diode assembly 200 includes a fiber-coupled laser (or pump) diode 202 and its integrated fiber 204, a temperature controlling element 206, and a spool 208. The integrated fiber 204 wraps around the spool 208, which is a metal cylindrical piece sandwiched between a metal rim at each end of the cylindrical piece.

The laser-diode enclosure 108 is comprised of metal or a metal alloy, for example, aluminum or steel. In a sidewall of the enclosure 108 is a fiber mating connector 210. The fiber mating connector 210 and the fiber optic adapter 113 mounted to the exterior side of the enclosure 108 may be a unitary component that passes through the enclosure bulkhead. One embodiment of the fiber mating connector 210 can be an FC/APC fiber optic connector. The fiber 204 of the fiber-coupled laser (or pump) diode 202, also referred to as the internal fiber (being internal to the enclosure 108), winds around the cylindrical piece of the spool 208 and terminates at the fiber mating connector 210, which brings the end of the internal fiber 204 into mating contact with an end of the external fiber 106. The internal fiber 204 is single mode or multimode; the type of the internal fiber 204 should match that of the external fiber 106 to achieve effective propagation of the pump light from the internal fiber 204 to the external fiber 106.

The fiber-coupled laser diode 202 is generally a device with an integrated optical fiber 204; the light generated by the device couples into the optical fiber. The fiber-coupled laser diode 202 can be a customized attachment of a fiber to the output of a laser diode or an off-the-shelf component, such as, for example, an 808 nm, 3.5 W, fiber-coupled laser diode, with an FC/APC connector, developed by II-VI, Inc., of Saxonburg, Pa.

The temperature controlling element 206 is disposed between, and makes physical contact with, a thermally conductive surface of the laser diode 202 and a thermally conductive surface of the enclosure 108. In FIG. 2, one surface of the temperature controlling element 206 is in physical contact with a bottom surface of the laser-diode 202 and another surface of the temperature-controlling element 206 is in physical contact with a recessed surface of the enclosure 108. The temperature-controlling element 206 operates as a heat sink for the laser diode 202; through temperature control, the light beam produced by the laser diode 202 is stable in power and wavelength. In one embodiment, the temperature-controlling element 206 is implemented with a thermoelectric cooler (or TEC or Peltier element) that is heat sunk to the enclosure. An internal or external power supply (not shown) can provide the operating voltage for the laser diode 202.

Figure 3:
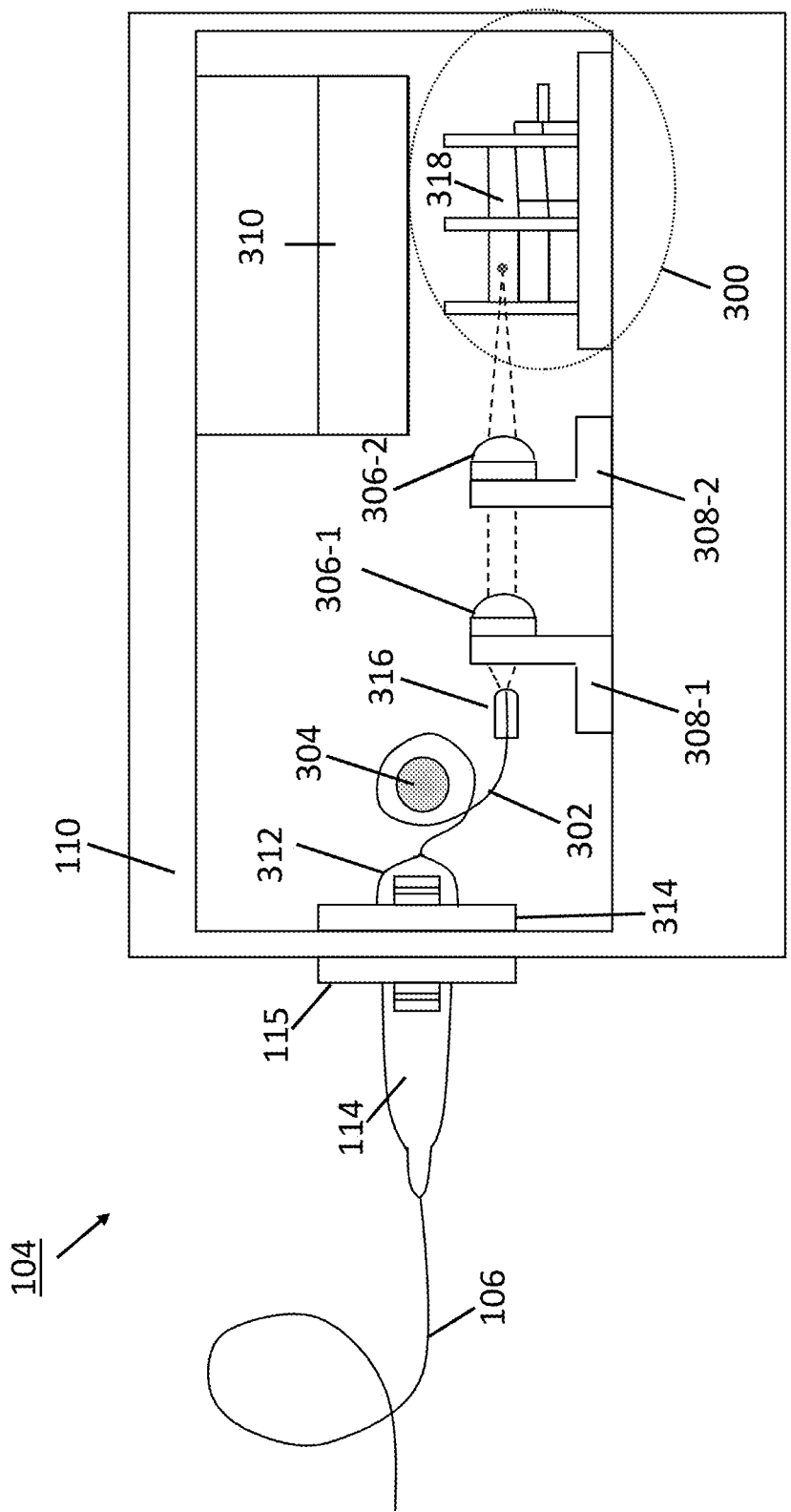
FIG. 3 is a cut-away of one embodiment of the laser-head module comprised of an enclosure housing a solid-state laser crystal assembly.

FIG. 3 shows a cut-away of one embodiment of the laser-head module 104 comprised of the enclosure 110, which is typically made of metal or metal alloy, for example, aluminum or stainless steel. The enclosure 110 houses a solid-state laser crystal assembly 300, a resident fiber 302 wrapped around a fiber mandrel 304, a lens assembly comprised of lenses 306-1, 306-2 (generally, 306) mounted on movable L-shaped sleds 308-1, 308-2 (generally, 308), respectively, a permanent magnet 310, and a fiber output coupler 316.

The solid-state laser crystal assembly 300 includes a thermally-controlled monolithic laser oscillator (or laser crystal) 318, herein called an enhanced monolithic ring oscillator or eMRO, built around a specially cut laser crystal with a specific geometry and optical coatings to yield a laser of exceptional spectral and spatial purity. Another embodiment of the thermally-controlled monolithic laser oscillator 318 is a nonplanar ring oscillator or NPRO.

The resident fiber 302 (referred to as resident because the fiber is internal to the laser-head enclosure 110) can be a single-mode or multimode fiber, its fiber type matching the type of the external fiber 106 that brings the pump light into the laser-head enclosure 110. One end of the resident fiber 302 terminates at a fiber connector 312. The fiber connector 312 connects to a fiber optic adapter 314 (e.g., FC/APC) mounted on the interior side of the laser-head enclosure 110. The fiber optic adapter 314 brings the end of the resident fiber 302 into mating contact with an end of the external fiber 106 connected to the fiber optic adapter 115 on the opposite, exterior side of the laser-head enclosure 110. The interior fiber optic adapter 314 and exterior fiber optic adapter 115 may be part of a unitary component that mounts to and passes through the enclosure 110. The other end of the resident fiber 312 (i.e., the output end) loops around the fiber mandrel 304 and connects to the fiber output coupler 316 that is attached firmly to the enclosure 110 near the first lens 306-1 (the output end of the resident fiber is approximately 1 mm from the first lens 306-1). The fiber mandrel 304 and the fiber output coupler 316 hold the resident fiber 302 firmly in place, ensuring the pump light that exits the resident fiber 302 in direct line with the first lens 306-1. The resident fiber 302 serves to decouple external environmental disturbances, such as movement and changes in ambient temperature and pressure of the external fiber 106, from affecting the precise pointing of the pump light at the laser crystal. Accordingly, any bending of the external fiber 106 and stress on the fiber adaptor 115 attached to the laser head enclosure 110 will not affect the pump mode illuminating the laser crystal. Therefore, the lasing mode should have a stable frequency and direction coming out of the laser crystal.

In one embodiment, the lenses 306 are gradient index or GRIN lenses. The lens 306-1 adjacent the output end of the resident fiber 302 operates to collimate the pump light coming out of the resident fiber 302. The other lens 306-2 focuses the collimated light onto on the laser crystal 318 to excite single-transverse-mode oscillations. The spacing between the lenses 306 is approximately 1 cm, and the spacing between the second lens 306-2 and the crystal 318 is about 1 cm. Both spacings are adjustable. The movability of the L-shaped sleds 308 allows for adjustments to the positioning of the lenses 306 between the resident fiber 302 and the laser crystal 318. Such adjustments are generally factory preset. Sliding the lenses 306 on the L-shaped sleds 308 back and forth adjusts and focuses the pump beam to an optimal spot size on the crystal. This optimal spot size depends on the desired wavelength and power of the output laser beam. After the optimal spot size is attained, moving the second focusing lens 306-2 planarly adjusts the location of the pump light beam on the face of the crystal 318 until the maximum output of the crystal 318 is attained. The lenses 306 are then securely fastened to the enclosure 110 to prevent any incidental movement.

The permanent magnet 310 is disposed to face the top of the laser crystal assembly 300 such that its magnetic field passes through the crystal 318 and forces the laser ring oscillations in one direction. Accordingly, this magnet 310 controls the single-direction lasing in the crystal 318. The laser mode is based on the geometry of the solid-state crystal 308, solid-state crystal coatings, and the spot size of the pump light.

Pumping the crystal 318 with the pump light produced by the pump module 102 occurs generally as follows. The external fiber 106 conveys the pump light from the pump module 102 to the fiber optic adapters 115, 314 mounted to the laser-head enclosure 110. The pump light propagates into the resident fiber 302, which conveys the pump light towards the first lens 306-1 of the lens assembly. The pump light exits the resident fiber 302 passes through free space to and through the first collimating lens 306-1 mounted on the L-shaped sled 308-1. After passing through the collimating lens 306-1, the pump light continues through free space and passes through the second focusing lens 304-2 mounted on the L-shaped sled 308-2 to focus the pump light through free space onto a face of the crystal 318.

Figure 4:
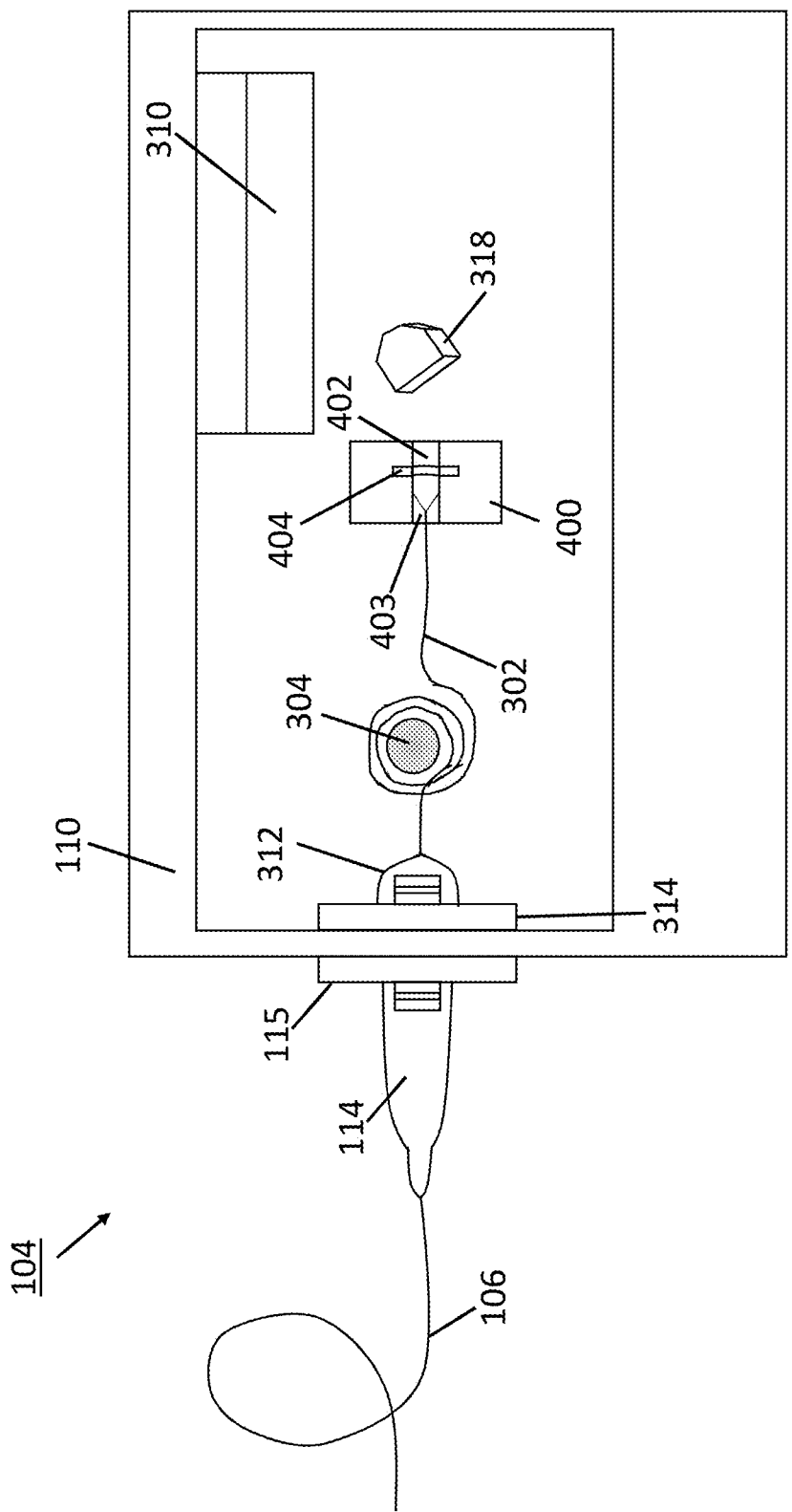
FIG. 4 is another embodiment of the laser-head module showing a v-groove mount that is used to firmly hold a resident fiber in place within the enclosure of FIG. 3 and to couple the fiber to a lens assembly.

FIG. 4 shows another embodiment of the laser-head module 104 showing a v-groove mount 400 that is used to firmly hold the resident fiber 302 in place within the enclosure 110 and to couple the fiber 302 to a lens assembly 402. The v-groove mount 400 is secured to the enclosure 110. The resident fiber 302 and lens assembly 402, comprised of the collimating and focusing lenses (FIG. 3), reside within the v-shaped groove 403 of the mount 400. An adjustable clamp 404 secures the lens assembly 402 to the mount 400 and allows for adjustments to the positioning of the lens assembly 402 within the groove 403. The output end of the resident fiber 302 is coupled to one end of the lens assembly 402. The laser crystal 318 (the full laser crystal assembly is omitted to simplify the drawing) is disposed at the output end of the lens assembly 402, in the path of the pump light propagating through the lenses. Any adjustments to the position of the lens assembly 402 within the groove 403 affects both lenses 306-1, 306-2 (FIG. 3) together; that is, any such adjustments will change the spacing between the lens assembly 402 and the crystal 318 but will not affect the spacing between the two lenses in the lens assembly 402.

Figure 5:
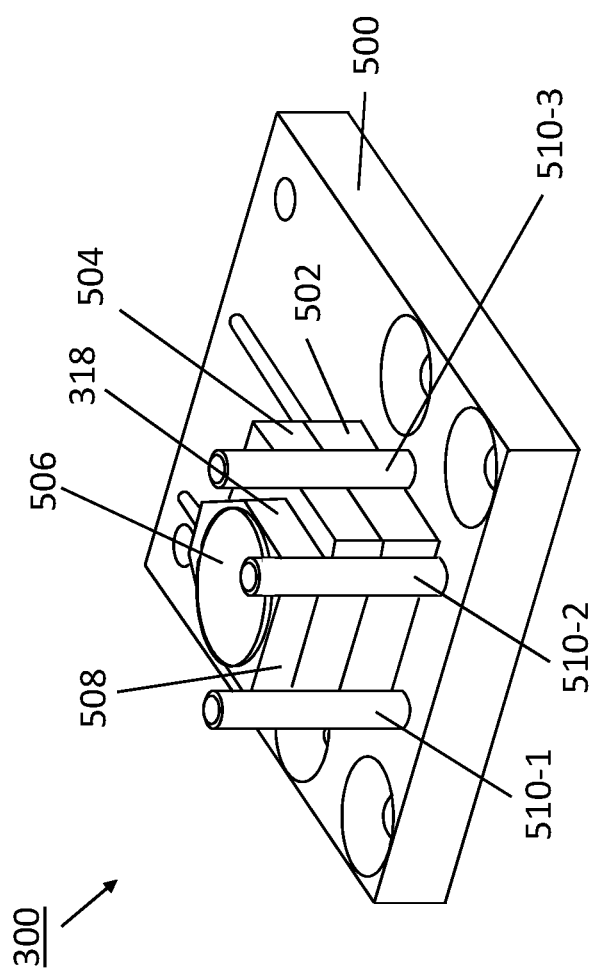
FIG. 5 is an isometric view of one embodiment of the solid-state laser crystal assembly comprising of a mounting base, a heat-controlling element, a plate with a thermistor, a laser crystal, and a piezoelectric device.

FIG. 5 shows an elevated view of an embodiment of the solid-state laser crystal assembly 300 (FIG. 3) that is housed within the laser-head enclosure 110 (FIG. 1). The solid-state laser crystal assembly 300 comprises a mounting base 500, a heat-controlling element 502 disposed on the base 500, a plate 504, with a temperature measurement device (i.e., thermistor), disposed on the heat-controlling element 502, the laser crystal 318 on the plate 504, and a piezoelectric (PZT) device 506 (or magnetic tuning device) disposed on the laser crystal 318. In one embodiment, the base 500 is approximately 21.5 mm wide×25 mm long×3 mm thick, the crystal stack is approximately 6.8 mm in height, the heat-controlling element 502 and plate 504 are both approximately 8 mm wide, 9 mm in length, and 2.5 mm thick, and the crystal 318 is about 6 mm wide, 8 mm in length and 1.7 mm thick. Epoxy between each pair of adjacent components in the crystal stack (i.e., the heat-controlling element, plate, laser crystal, and PZT device), and between the crystal stack and the base 500, produces strong bonds that prevent any component from moving. Being permanently fixed in place is essential for the crystal assembly 300 to achieve proper alignment with the incoming pump light and for proper operation of laser-head module, since movement of these stack components can compromise the stability of the laser-head module.

The mounting base 500 holds the crystal stack in position for the incoming pump light to strike the front face 508 of the laser crystal 318 at a specific angle (in one embodiment, at a 45-degrees angle of incidence). Three pins 510-1, 510-2, 510-3 (generally, 510) rise vertically from the base 500 and abut the stack: two pins 510-1, 510-2 abut the front face 508 of the crystal 318 at opposite corners, the third pin 510-3 abuts the crystal stack approximately midway on the near side (from the perspective of FIG. 5). The pins 510 serve to guide or constrain the crystal stack to a precise location within the laser-head enclosure, the precise location where the laser crystal can be optimally pumped to achieve maximum laser power.

The heat-controlling element 502, which in one embodiment is a thermo-electric cooler or TEC, operates to heat, cool, and stabilize the temperature of the laser crystal 318. The temperature tunes the optical wavelength of the laser light outputted by the laser crystal 318.

In addition to operating as a temperature reading device, the plate 504 operates as a heat-transfer element for transferring heat between the laser crystal 318 and the heat-controlling element 502.

The laser crystal 318 is the gain medium to be pumped by the pump light, operating as a unidirectional ring resonator. In one embodiment, the host material of the crystal 318 is yttrium aluminum garnet (YAG) doped with neodymium (Nd3+) ions. In a specific example, when the laser crystal 318 is fabricated using this host material and pumped with pump light having a wavelength of approximately 808 nm, the laser crystal produces a tunable lasing wavelength at 1064 nm or 1319 nm. The output of the low-power ring-oscillator can be in the near-infrared region of the spectrum. In particular, pumping the laser crystal 318 can obtain single-mode power of over several watts at 1064 nm or up to a watt at 1319 nm.

The PZT 506 is adapted to control the lasing wavelength of the laser crystal 318. Applying a voltage to the PZT 506 (by way of an external voltage supply) causes the PZT to produce a mechanical strain. With the PZT mounted atop the laser crystal 318, the mechanical strain operates to squeeze the laser crystal. Working in conjunction with the temperature control provided by the heat-controlling element 502, this squeezing provides fine and fast control of the lasing wavelength of the laser crystal 318.

Figure 6:
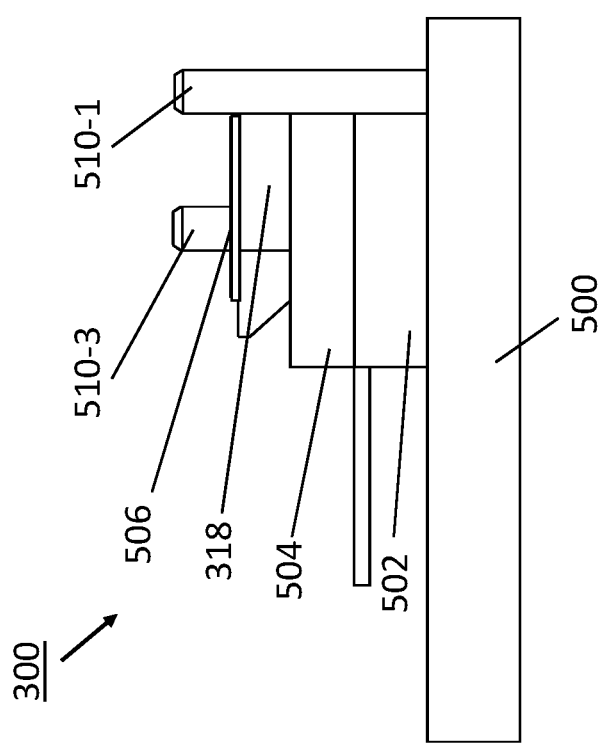
FIG. 6 is a side view of one embodiment of the solid-state laser crystal assembly comprising of the mounting base, heat-controlling element, plate with a thermistor, laser crystal, and piezoelectric device.
Figure 7:
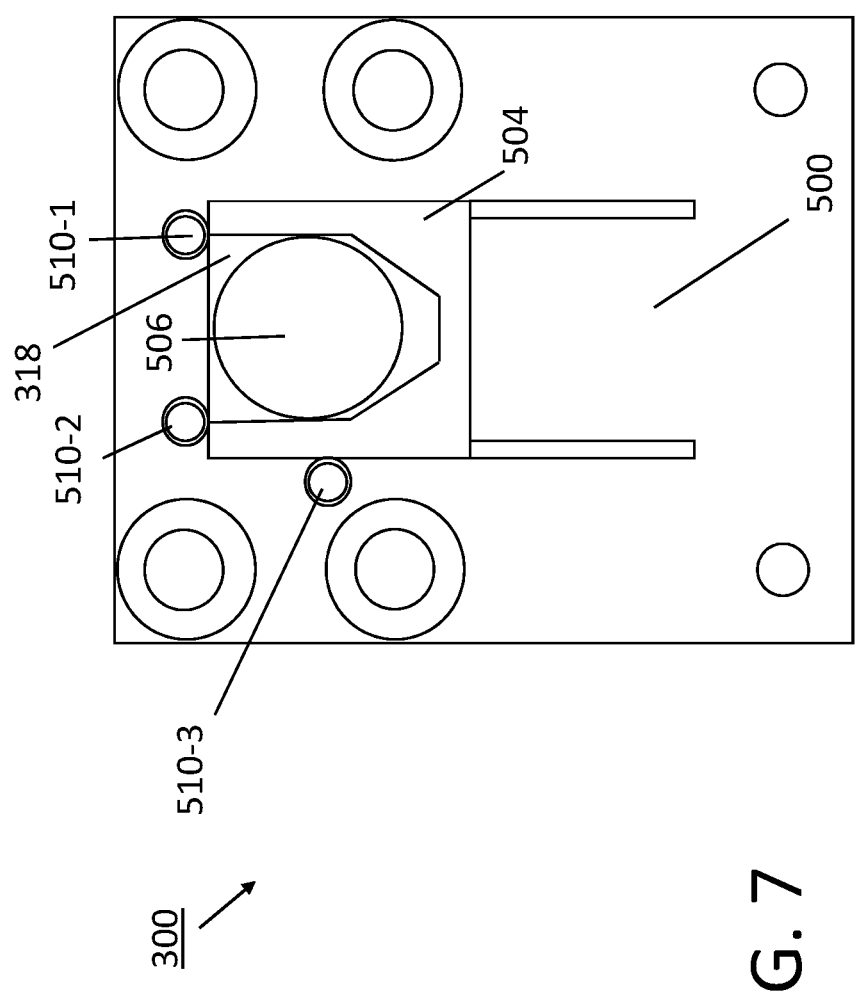
FIG. 7 is a top view of one embodiment of the solid-state laser crystal assembly comprising of the mounting base, heat-controlling element, plate with a thermistor, laser crystal, and piezoelectric device.

FIG. 6 shows a side view and FIG. 7 shows a top view of the laser crystal assembly 300 comprised of the mounting base 500, the heat-controlling element 502, the plate 504 with thermistor, the piezoelectric device 506, and the laser crystal 318 disposed between the plate 504 and piezoelectric device 506.

Figure 8:
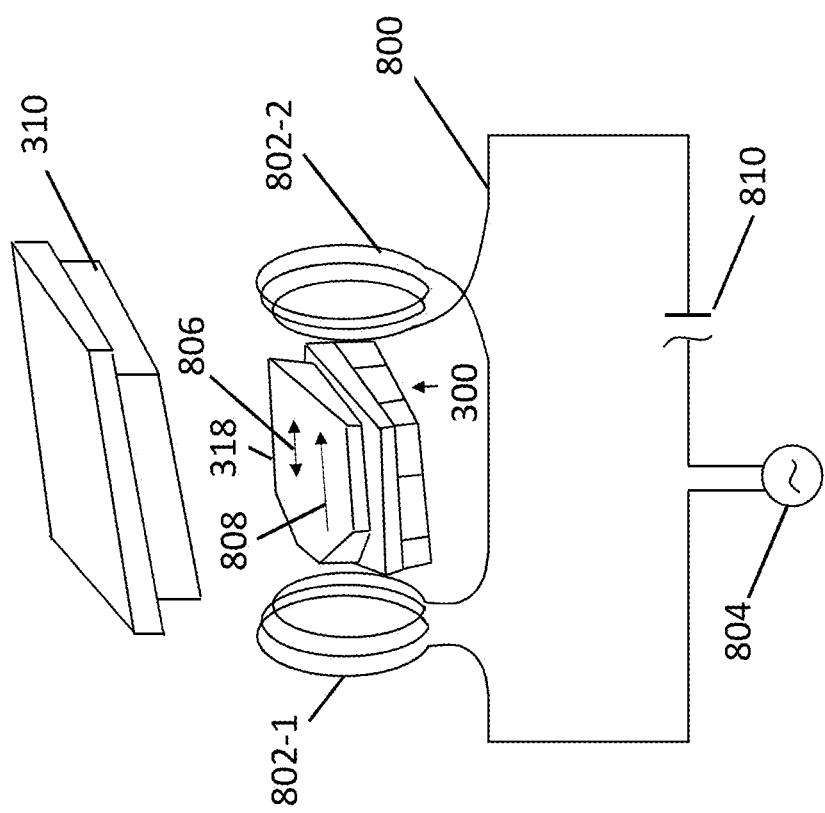
FIG. 8 is a diagram of one embodiment of a non-contact magnetic tuning system used to tune the frequency of the laser crystal.

FIG. 8 shows an example of a technique for modulating the lasing wavelength using magnetic tuning. A radiofrequency (RF) coil (i.e., coil magnet) 800 is placed adjacent the solid-state laser crystal assembly 300 to produce a uniform AC magnetic field across the thickness of the laser crystal 318. In the embodiment shown, the RF coil 800 is implemented with a Helmholtz coil, which is a device comprised of two coils 802-1, 802-2 (generally, 802). The radius of each of the two coils 802 is equal to the separation between the two coils. In this embodiment, the laser-crystal assembly 300 is disposed between the two coils. An external RF source 804 drives the RF coil 800 which produces an AC magnetic field across the laser crystal 318 in an alternating direction illustrated by the double-headed arrow 806. The magnitude of the AC field is approximately 0.1 Tesla. A high-current (approximately 1 amp) capacitor 810 resonantly enhances the RF drive, significantly lowering the current drive requirements to the Helmholtz coil to achieve the desired magnetic field. The permanent magnet 310 produces a DC magnetic field in the direction illustrated by the arrow 808. The lengths of the arrows 806, 808 correspond generally to the relative strengths of the magnetic fields produced by the RF coil 800 and permanent magnet 310, respectively.

The resulting AC magnetic field changes the polarization rotation and introduces a round-trip phase change of the lasing mode. The resonantly enhanced RF drive to the RF coil 800 allows modulation of the frequency of the lasing mode at several hundreds of kilohertz, based on the Verdet constant of crystal material (e.g., Nd:YAG), and imparts sidebands to the optical carrier without residual amplitude modulation (RAM). These sidebands are then used to lock the laser to an optical cavity or a molecular transition, which is one of the common uses of ultra-stable lasers such as the one produced by solid-state crystals. Magnetic tuning using the RF coil 800 eliminates the residual amplitude modulation introduced when external electro-optic modulators (EOMs) are used for laser light modulation.

In addition, optical clocks require locking laser light to the length of an ultra-stable optical cavity or an absorption transition in a gas. These locking schemes require modulation of the carrier light. Therefore, the stability of magnetically modulated laser crystals used in frequency standards will be superior to those that employ EOMs.

Examples of applications for which the technologies described herein can be used include, but are not limited to, coherent detection, telecommunications, satellite communication, LIDAR, interferometry, gravitational wave detectors, injection seeding, precision metrology, beat-note generation, satellite reconnaissance and autonomous driving.

Figure 9:
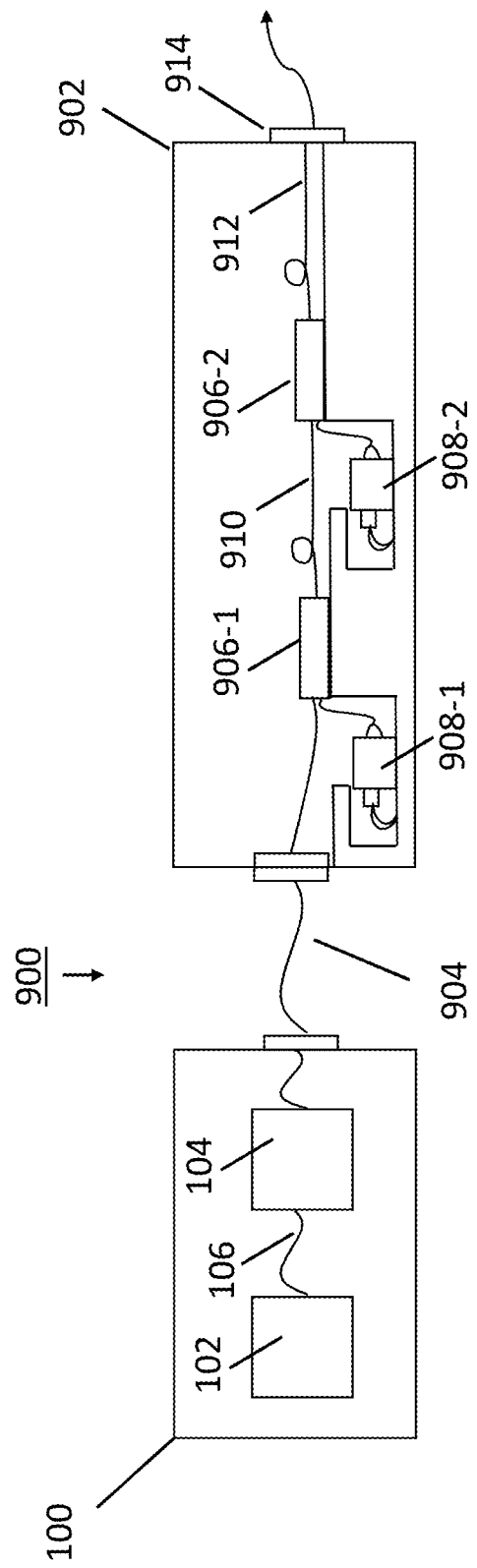
FIG. 9 is an example of an application for using laser light produced by the laser system of FIG. 1, including a single-mode, low-noise, fiber-coupled amplifier that can scale the laser light to a multi-watt or kilowatt power level.

FIG. 9 shows an example of a system 900 that amplifies the single-frequency single-mode laser light produced by the laser system 100. The system 900 includes the laser system 100 connected to a single-mode laser amplifier module 902 by a single-mode fiber optic cable 904. The laser system 100 comprises the laser-diode module 102 connected to the laser-head module 104 by the external fiber 106. (The laser-diode module 102 and laser-head module 104 are in separate enclosures; these separate enclosures can be housed within a single enclosure.) The laser-head module 104 outputs laser light to the single-mode fiber optic cable 904. Through the fiber 904, the laser light propagates to the laser amplifier module 902 (a separate enclosure).

The laser amplifier module 902 comprises wavelength division multiplexers (WDM) 906-1, 906-2 (generally, 906) and a plurality of fiber-coupled laser diodes 908-1, 908-2 (generally, 908). The WDMs 906 and laser diodes 908 are heat sunk to the enclosure of the laser amplifier module 902. WDM 906-1 combines the incoming laser light with the pump light from the laser diode 908-1 and produces a first output beam. A doped gain fiber 910 connects the output port of the first WDM 906-1 to an input port of the second WDM 906-2 and conveys the first output beam thereto. The WDM 906-2 combines this first output beam with pump light from the fiber-coupled laser diode 908-2 and produces a second output beam. A doped gain fiber 912 connects the output port of the WDM 906-2 to an output connector 914 of the laser amplifier module 902. Each of the gain fibers 910, 912 are appropriately doped to provide amplification at the desired wavelength. Accordingly, in a modular manner, the system 900 generates low-noise, single-frequency, single-mode laser power at substantial power levels. By the system 900, the stability of the low-power source is transferred to the high-power output of the laser amplifier module 902 with a minimum noise penalty especially when the laser amplifier is saturated. The output of the laser amplifier can be used to drive a nonlinear crystal (similar to that described in connection with FIG. 10 and FIG. 11) to produce light of other wavelengths through parametric conversion at substantial power levels of several watts.

Figure 10:
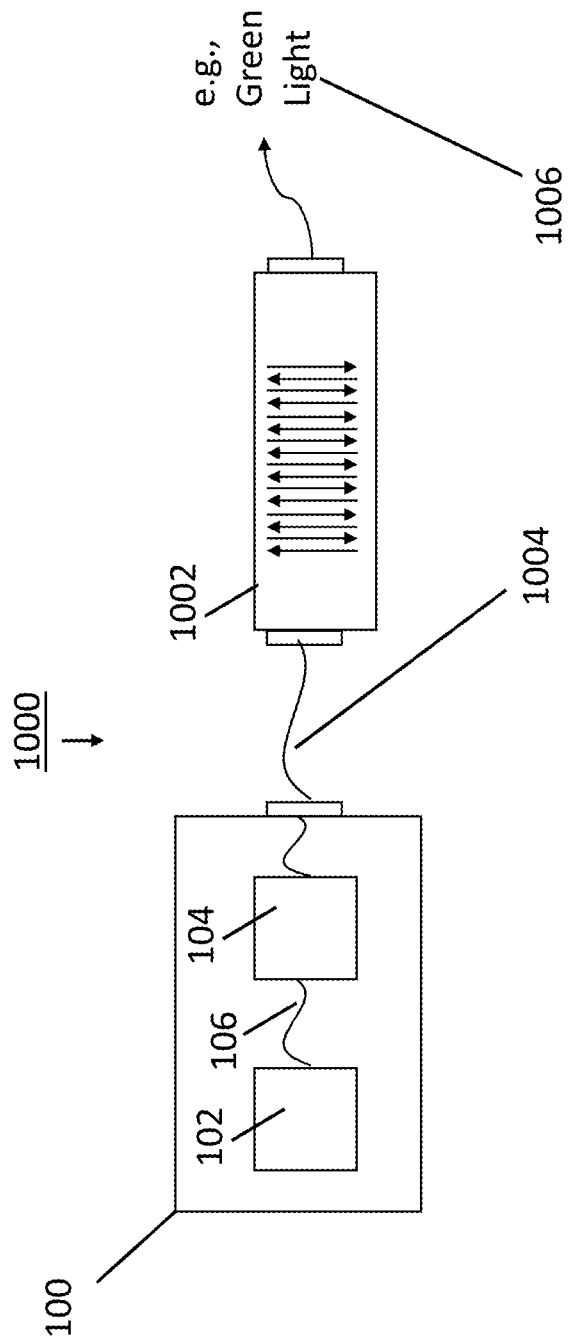
FIG. 10 is an example of an application for changing the wavelength of the laser light produced by the laser system of FIG. 1, including a nonlinear crystal that achieves the wavelength conversion.

FIG. 10 shows an example of a system 1000 that changes the wavelength of single-mode laser light produced by the laser system 100 by directing the laser light into a nonlinear crystal. The system 1000 includes the laser system 100 connected to a periodically poled nonlinear crystal chip 1002 by a single-mode fiber optic cable 1004. An embodiment of the nonlinear crystal could be fabricated as a bulk or waveguide device using periodically poled lithium niobite (PPLN) or periodically poled lithium tantalate (PPLT) material. The laser system 100 comprises the laser-diode module 102 connected to the laser-head module 104 by the external fiber 106. (Again, the laser-diode module 102 and laser-head module 104 are in separate enclosures; these separate enclosures can be housed within a single enclosure.) The laser-head module 104 outputs laser light to the single-mode fiber optic cable 1004. Through the fiber 1004, the laser light propagates to and is mode matched to the chip 1002. From this input laser light, the chip 1002 takes advantage of the coherence of the laser source to produce visible light 1006. For example, an appropriately structured chip 1002 can generate green light having a modest amount of power (e.g., milliwatt) from an input laser light tuned to 1064 nm.

Figure 11:
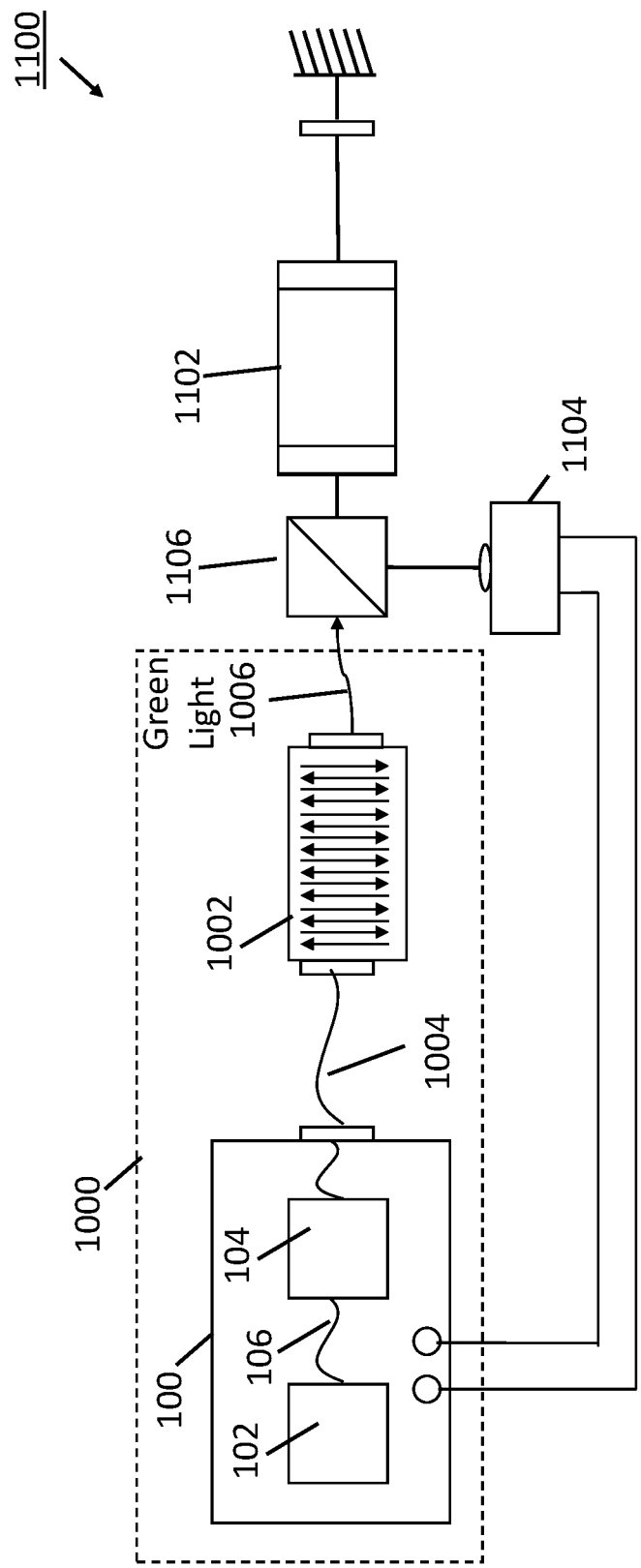
FIG. 11 is an example use of the application of FIG. 10 for generating green light from the laser light produced by the laser system of FIG. 1, to probe an iodine microcell for an ultra-stable molecular clock.

FIG. 11 shows an embodiment of a system 1100 that uses the wavelength conversion system 1000 of FIG. 10 to lock the laser. The system 1100 includes the wavelength conversion system 1000 coupled to a small iodine cell 1102. The visible light (e.g., green light) of the chip 1002 propagates to the small iodine cell 1102. The visible light has sufficient power to excite visible transitions in this iodine cell 1102, to enable locking the laser crystal of the laser-head module 104 to the stable molecular transition in iodine. Using a small iodine cell 1102 of about 1-2 cm in length and a low-power version of the laser system 100, the total power consumption of the complete laser system 1100, including the nonlinear crystal 1002, can be kept at levels of 100 mW.

The system 1100 further includes a control system 1104 and polarization optics 1106 for the laser locking. The control system 1104 is in communication with the laser system 100 and has adequate signal-to-noise ratio to enable stabilization of the laser light source to levels that are better than 1 part in $10^{13}$. This yields a compact, ultra-low power, ultra-stable molecular clock. This system 1100 has immediate applications in cold atom technologies for producing space-based ultra-stable clocks at stability levels surpassing 1 part in $10^{17}$ with minimal power consumption.

Figure 12:
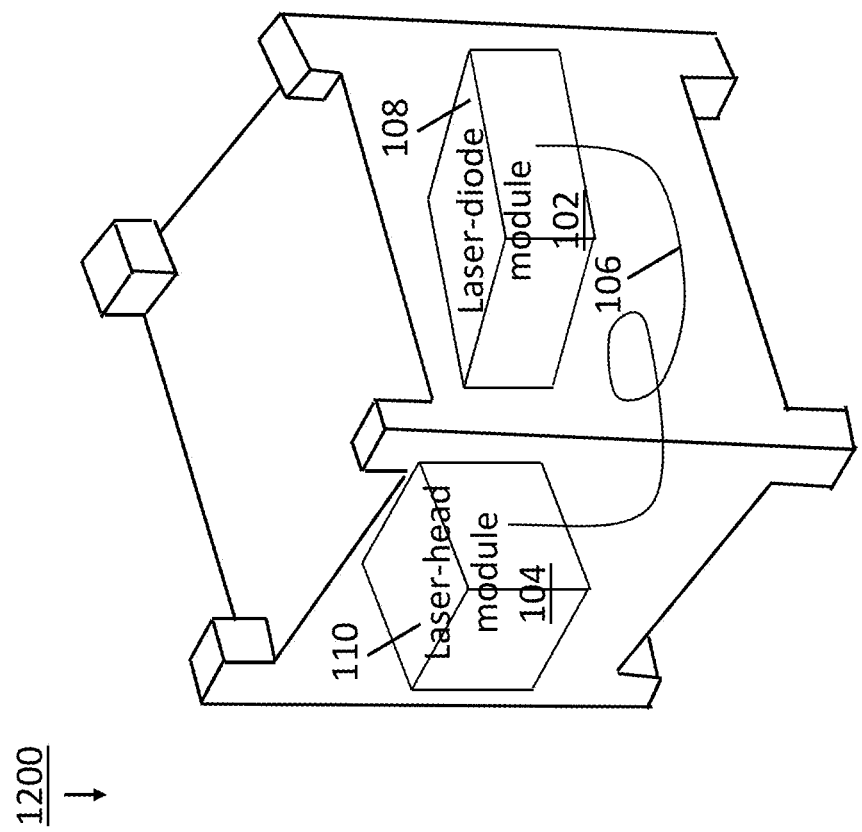
FIG. 12 is a diagram of an example payload in which the laser-head enclosure and laser-diode enclosure are separately packaged.

FIG. 12 shows an example of an enclosure 1200 in which the laser-head enclosure 110 and laser-diode enclosure 108 may be packaged separately, operably connected to each other by the external fiber 106. The enclosure 1200 can be, for example, a payload on a cubesat or small, micro, or nano-satellite. Separation of the laser-head enclosure 110 from the laser-diode enclosure 108 allows flexible packaging of these subsystems within the enclosure 1200, which advantageously enables efficient design and thermal management of a payload. Tethered by the external fiber cable 106, each of the enclosures 108, 110 can be placed within the satellite at an available location, suitable for thermal management of the payload.

As will be appreciated by one skilled in the art, aspects of the present invention may be embodied as a system, method, and apparatus. Thus, some aspects of the present invention may be embodied entirely in hardware, entirely in software (including, but not limited to, firmware, program code, resident software, microcode), or in a combination of hardware and software.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. References to "one embodiment" or "an embodiment" or "another embodiment" means that a feature, structure or characteristic described in connection with the embodiment is included in at least one embodiment described herein. References to one embodiment within the specification do not necessarily all refer to the same embodiment. The features illustrated or described in connection with one exemplary embodiment may be combined with the features of other embodiments.

Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only, and the scope of the invention should be determined from proper construction of the appended claims, and their equivalents.

What is claimed is:

1. A laser system comprising:
a fiber optic cable;
a pump enclosure connected to a first end of the fiber optic cable that terminates at an external side of the pump enclosure, the pump enclosure housing a fiber-coupled laser diode with an integrated fiber, the fiber-coupled laser diode being configured to produce and convey pump light through the integrated fiber out of the pump enclosure to the fiber optic cable; and
a laser-head enclosure connected to an opposite end of the fiber optic cable that terminates at an external side of the laser-head enclosure, the laser-head enclosure housing a crystal and a resident fiber, the resident fiber being disposed entirely within the laser-head enclosure in such a manner that the resident fiber decouples external environmental disturbances, including movement and changes in ambient temperature and pressure of the external fiber optic cable, from affecting a precise pointing of the pump light at the crystal, the pump light, when produced by the fiber-coupled laser diode, propagating from the integrated fiber of the fiber-coupled laser diode into the fiber optic cable, from the fiber optic cable into the resident fiber within the laser-head enclosure, and from the resident fiber into free space and onto a face of the crystal, the crystal being adapted to produce a laser beam in response to the pump light.

2. The laser system of claim 1, wherein the integrated fiber of the fiber-coupled laser-diode, the resident fiber, and the fiber optic cable comprise single-mode fibers.

3. A laser-head module comprising:
a modular enclosure with a wall having a fiber optic adapter adapted to connect to one end of an external fiber that conveys pump light from an external pump light source to the enclosure, the enclosure housing:
a laser-crystal assembly with a crystal;
a resident fiber disposed entirely within the enclosure in such a manner that the resident fiber decouples external environmental disturbances, including movement and changes in ambient temperature and pressure of the external fiber, from affecting a precise pointing of the pump light at the crystal, an input end of the resident fiber being coupled to the one end of the external fiber by the fiber optic adapter to receive the pump light conveyed by the external fiber from the external pump light source, and an output end of the resident fiber being fixedly coupled to the enclosure such that the output end points the pump light exiting the resident fiber into free space at the crystal; and
a lens assembly disposed between the output end of the resident fiber and the crystal, the lens assembly focusing the pump light exiting the output end of the resident fiber onto a face of the crystal, the crystal being adapted to produce a laser beam in response to the pump light.

4. The laser-head module of claim 3, wherein the resident fiber comprises a single-mode fiber.

5. The laser-head module of claim 3, wherein the enclosure further houses a permanent magnet disposed near the crystal, the permanent magnet producing a magnetic field across the crystal that causes the crystal to lase in one direction.

6. The laser-head module of claim 3, wherein the lens assembly includes first and second spaced apart lenses, the first lens collimating the pump light exiting the output end of the resident fiber and the second lens focusing the collimated pump light onto the face of the crystal.

7. The laser-head module of claim 3, wherein the laser-crystal assembly includes a piezoelectric device disposed adjacent to the crystal, the piezoelectric device being adapted to control of a lasing wavelength of the crystal in response to a voltage applied to the piezoelectric device.

8. The laser-head module of claim 3, wherein the laser-crystal assembly includes a heat-controlling element in thermal communication with the crystal, the heat-controlling element being adapted to control a temperature of the crystal in order to control a lasing wavelength of the crystal.

9. The laser-head module of claim 3, further comprising a radiofrequency (RF) coil disposed close enough to the crystal such that an AC magnetic field produced by the RF coil passes through the crystal and tunes a lasing wavelength of the crystal.

10. The laser-head module of claim 3, wherein the manner in which the resident fiber is disposed within the enclosure includes looping a portion of the resident fiber around a fiber mandrel.

11. The laser-head module of claim 3, further comprising a fiber output coupler attached firmly to the enclosure near the lens assembly, and wherein the manner in which the resident fiber is disposed within the enclosure includes connecting the output end of the resident fiber to the fiber output coupler.

12. The laser-head module of claim 3, further comprising a mount with a v-shaped groove fixed near the crystal, wherein the lens assembly is disposed in the v-shaped groove, and the manner in which the resident fiber is disposed within the enclosure includes coupling the output end of the resident fiber to the lens assembly.

13. A method for generating laser light comprising the steps of:
generating pump light by a fiber-coupled laser diode with an integrated fiber housed within a first enclosure;
conveying the pump light from the integrated fiber of the fiber-coupled laser diode out of the first enclosure into one end of a fiber cable that is external to the first enclosure;
conveying the pump light from an opposite end of the external fiber cable into one end of a resident fiber disposed internally within a second enclosure that houses a crystal assembly;
arranging the resident fiber within the second enclosure in such a manner that the resident fiber decouples external environmental disturbances, including movement and changes in ambient temperature and pressure of the external fiber cable, from affecting a precise pointing of the pump light at the crystal assembly;
pumping a crystal of the crystal assembly with the pump light exiting into free space from an opposite end of the resident fiber onto a face of the crystal to produce laser light; and
emitting the laser light from the second enclosure.

14. The method of claim 13, further comprising inducing the crystal to lase in one direction by generating a magnetic field across the crystal.

15. The method of claim 13, further comprising the steps of:
collimating the pump light exiting the output end of the resident fiber; and
focusing the collimated pump light onto a face of the crystal.

16. The method of claim 13, further comprising tuning a lasing wavelength of the crystal by applying a voltage to a piezoelectric device disposed adjacent to the crystal.

17. The method of claim 13, further comprising tuning a lasing wavelength of the crystal by controlling a temperature of the crystal.

18. The method of claim 13, further comprising tuning a lasing wavelength of the crystal by producing with a radio frequency coil a uniform AC magnetic field across the crystal.

19. The method of claim 13, wherein the integrated fiber of the fiber-coupled laser diode housed within the first enclosure, the external fiber cable, and the resident fiber disposed internally within the second enclosure are single-mode fibers.

20. A laser-head module comprising:
an enclosure with a wall having a fiber optic adapter adapted to connect to one end of an external fiber that conveys pump light from an external pump light source to the enclosure, the enclosure housing:
a laser-crystal assembly including a crystal;
a resident fiber disposed entirely within the enclosure, the resident fiber having an input end coupled to the one end of the external fiber by the fiber optic adapter to receive the pump light conveyed by the external fiber from the external pump light source and an output end fixedly coupled to the enclosure such that the output end points the pump light exiting the resident fiber into free space at the crystal, the resident fiber being arranged within the enclosure in such a manner that the resident fiber decouples external environmental disturbances, including movement and changes in ambient temperature and pressure of the external fiber, from affecting a precise pointing of the pump light at the crystal;
a lens assembly disposed adjacent to the output end of the resident fiber, the lens assembly focusing the pump light exiting the output end of the resident fiber onto a face of the crystal of the laser-crystal assembly, the crystal being adapted to produce a laser beam at a wavelength in response to the pump light; and
a radiofrequency (RF) coil disposed near the crystal, the RF coil producing, when driven by an external RF source, an AC magnetic field in an alternating direction across the crystal that tunes the wavelength of the laser beam produced by the crystal.

21. The laser-head module of claim 20, wherein the radiofrequency (RF) coil comprises a Helmholtz coil comprised of two spaced apart coils, wherein a radius of each of the two coils is equal to a separation between the two coils, and wherein the crystal is disposed between the two coils.

* * * * *